United States Patent
Tsukamoto

[11] Patent Number: 5,868,848
[45] Date of Patent: Feb. 9, 1999

[54] PLASMA PROCESSING APPARATUS

[75] Inventor: Yuji Tsukamoto, Yamanashi-ken, Japan

[73] Assignee: Tokyo Electron Limited, Tokyo, Japan

[21] Appl. No.: 659,655

[22] Filed: Jun. 6, 1996

[30] Foreign Application Priority Data

Jun. 7, 1995 [JP] Japan .................................. 7-166865

[51] Int. Cl.$^6$ ...................... C23C 16/00; C23C 14/00; B28B 1/02; H01J 7/24

[52] U.S. Cl. ............... 118/723 E; 156/345; 204/298.32; 204/298.34; 315/111.21

[58] Field of Search ...................... 118/723 E; 156/345; 204/298.32, 298.34; 315/111.21

[56] References Cited

U.S. PATENT DOCUMENTS

| | | | |
|---|---|---|---|
| 4,333,814 | 6/1982 | Kuyel | 204/298 |
| 4,602,981 | 7/1986 | Chen et al. | 156/627 |
| 5,275,683 | 1/1994 | Arami et al. | 156/345 |
| 5,665,166 | 9/1997 | Deguchi et al. | 118/723 E |

Primary Examiner—Gary Geist
Assistant Examiner—Brian J. Davis
Attorney, Agent, or Firm—Oblon, Spivak, McClelland, Maier & Neustadt, P.C.

[57] ABSTRACT

Disclosed is an etching apparatus for etching wafer W held on an electrostatic chuck 11 by using a plasma generated in a space between an upper electrode 21 and a susceptor 5 in a processing chamber 2. The plasma is generated by supplying a high frequency power from a high frequency power supply 43 via a power supply line 42. The etching apparatus includes a measuring electrode 18 made of silicon, attached to a focus-ring 17 provided around wafer W. The measuring electrode 18 can be electrically connected to a susceptor 5. A lead wire 44 is used, an end of which is connected to the power supply bar 42 and the other end of which is connected to a voltage indicator 46 for monitoring $V_{DC}$ via an RF filter 45. The $V_{DC}$ level having a constant correlation with the $V_{DC}$ generated on wafer W, can be detected through monitoring by the voltage indicator 46.

12 Claims, 3 Drawing Sheets

PLASMA PROCESSING APPARATUS

BACKGROUND OF THE INVENTION

1. Field of the Invention

The present invention relates to a plasma processing apparatus for processing an object to be processed such as a semiconductor wafer by use of a plasma, more specifically, for plasma etching.

2. Description of the Related Art

In a semiconductor manufacturing process, a plasma has been conventionally employed for etching the surface of a semiconductor wafer (hereinafter referred to as "wafer"). In the plasma etching, ion energy is greatly influenced by a self bias electric potential ($V_{DC}$) generated on a wafer. Hence, it is quite important to measure $V_{DC}$ in the semiconductor manufacturing process.

$V_{DC}$ is measured, for example, by a $V_{DC}$ measuring terminal provided to a clamp when a wafer is mechanically held by the clamp. However, such a $V_{DC}$ measuring terminal cannot be directly used when a wafer is electrostatically held by an electrostatic chuck formed of a conductive body coated with an insulating material such as a polyimide resin, since the conductive body is not exposed to a plasma. Hitherto, $V_{DC}$ is measured through monitoring by an appropriate lead wire, an end of which is connected to a high-frequency power supply passage for supplying a high-frequency power from the outside to the lower electrode of a processing chamber, and the other end of which is connected to a $V_{DC}$ monitor via an RF (radio frequency) filter.

In this case, however, if $V_{DC}$ is directly obtained by monitoring from the high-frequency power supply passage, the $V_{DC}$ value obtained is not accurate for two reasons. First, the outer peripheral surface of the lower electrode is usually insulated with an anodized aluminum. Second, an insulated electrostatic chuck is provided to the upper surface of the lower electrode, as mentioned above.

Jpn. Pat. Appln. KOKAI Publication No. 6-232088 discloses a technique for monitoring the $V_{DC}$ value by using a monitor terminal which is insulated from the power supply passage and independently provided around a substrate. However, since an independent monitor signal line must be provided in the lower electrode, the apparatus is complicated in structure. Accordingly, a simple plasma processing apparatus designed so as to obtain an accurate $V_{DC}$ value is desired.

SUMMARY OF THE INVENTION

The present invention has been made in view of the aforementioned problems and intended to provide a plasma processing apparatus simpler in structure than the conventional ones, designed so as to obtain an accurate $V_{DC}$ value.

The present invention provides a plasma processing apparatus for processing a substrate held on the lower electrode in the processing chamber by using a plasma generated by a high-frequency power. In the plasma processing apparatus of the present invention, a measuring electrode connected to the lower electrode is provided around the substrate to be processed so as to be exposed in the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
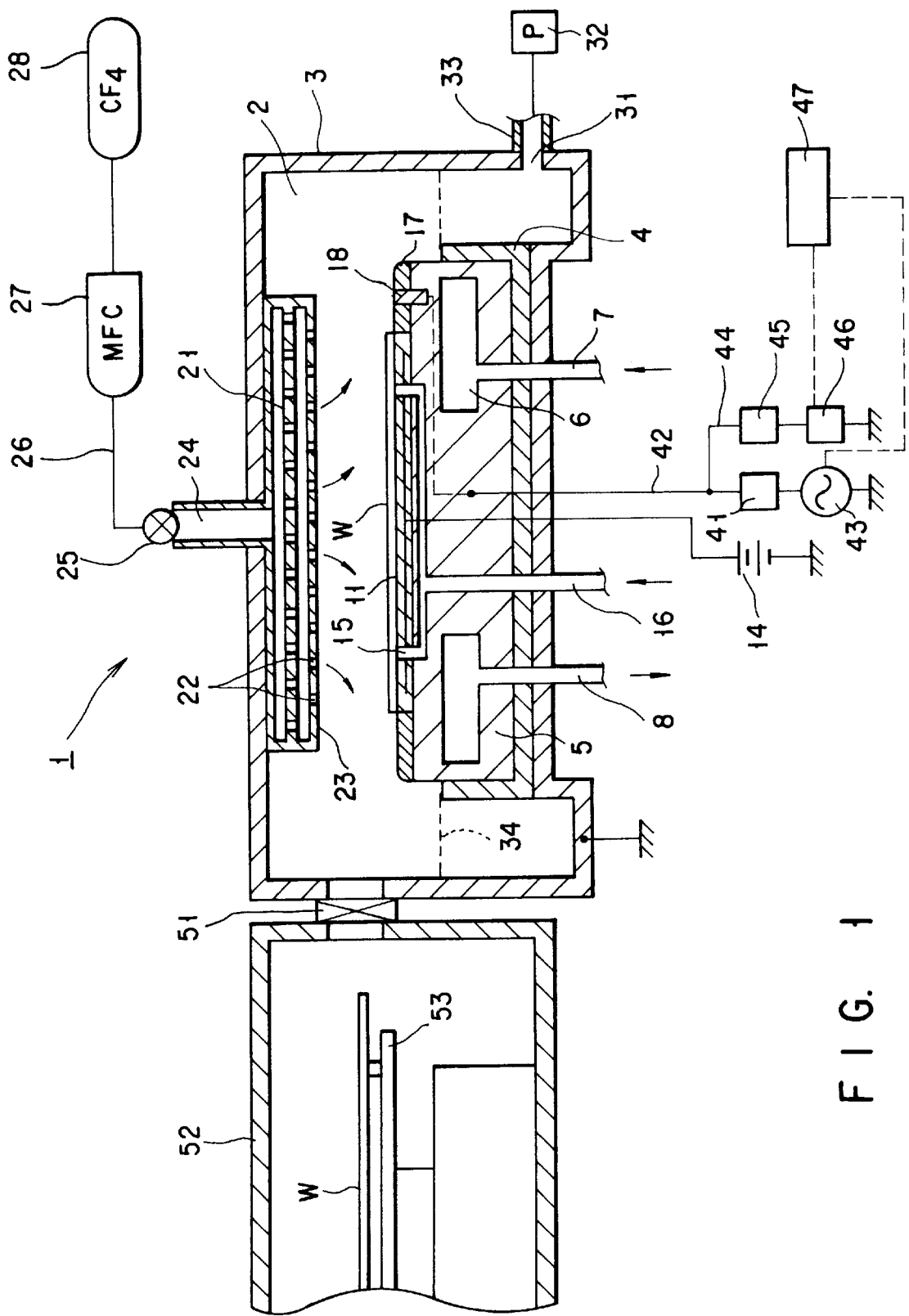
FIG. 1 is a schematic view for explaining a plasma etching apparatus as an example of the plasma processing apparatus of the present invention.

The plasma processing apparatus of the present invention is characterized in that a measuring electrode electrically connected to a lower electrode is provided around an object to be processed so as to be exposed to a plasma. Preferably the upper surfaces of the member constituting the measuring electrode is in the same plane as the lower electrode.

When the measuring electrode is positioned around the object, it may be provided to a focus-ring employed in a plasma processing apparatus of this type (e.g., an etching apparatus). In this case, the upper surface of the measuring electrode may be set so as to be in the same plane as the upper surface of the focus-ring.

Examples of a material for use in the measuring electrode include metals such as aluminum, tungsten, semiconductors such as silicon, and ceramics such as SiC. Considering that the measuring electrode is directly exposed to a plasma, the electrode is preferred to be made of silicon and SiC in order to avoid contamination. Furthermore, when the measuring electrode is attached to a focus-ring made of a conductive material or semiconductor, it is preferable that the electrode be made of the same material as used in the focus-ring in order to exclude influences by a partial change of impedance.

Since the measuring electrode is provided around the object, it is possible to measure a $V_{DC}$ level around the object. Since the measuring electrode is electrically connected to the lower electrode, they have the same electrical potential. Thus, the $V_{DC}$ level can be measured by connecting the $V_{DC}$ monitor via an appropriate lead wire in a power supply passage connected to the lower electrode. It is therefore not required to form an independent signal line for measuring the $V_{DC}$ level in the lower electrode. The power supply passage can be directly used as the $V_{DC}$ signal line.

In this construction, the upper surface of the measuring electrode are in the same plane as the surface of the member constituting the measuring electrode, so that $V_{DC}$ can be measured effectively without occurrence of an abnormal discharge even through an upper electrode is provided to a position opposed to the lower electrode.

To describe more strictly, since the measuring electrode is not provided onto an object, the $V_{DC}$ value measured by the measuring electrode is not completely identical to the $V_{DC}$ level generated on the object. However, the $V_{DC}$ level around the object is actually measured. Thus, a constant correlation is established between the $V_{DC}$ actually measured by the measuring electrode and the $V_{DC}$ generated on the object. If the correlation between the $V_{DC}$ level generated on the object and the $V_{DC}$ level measured by the measuring electrode is previously determined by using a dummy wafer, a real $V_{DC}$ level generated on the object can be immediately obtained on the basis of the $V_{DC}$ value measured by the measuring electrode.

The phrase "the measuring electrode is exposed" used herein means that the measuring electrode may be set in a plasma so as to generate $V_{DC}$ at the measuring electrode by being exposed to the plasma. In the expression "is in the same plane", both upper surfaces are not needed to be exactly in the same plane and may be acceptable as far as they are in the same plane enabling $V_{DC}$ generation without an abnormal discharge.

Hereinbelow, the plasma processing apparatus of the present invention will be described in detail with reference to accompanying drawings by taking a plasma etching apparatus as an embodiment.

FIG. 1 schematically shows a construction of plasma etching apparatus 1 according to the present invention. Reference numeral 2 is a processing chamber, which is formed in an air-tightly-closeable cylindrical processing vessel 3 made of anodized aluminum and the like. The processing vessel 3 itself is grounded on the earth. At the bottom of the processing chamber 2, a ceramics-insulated holding plate 4 is provided. Above the insulated holding plate 4, wafer W of, e.g., 8 inches diameter is provided as an object to be processed and a cylindrical susceptor 5 constructing a lower electrode, is provided.

Inside the susceptor 5, a ring-form refrigerant chamber 6 is provided. Into the refrigerant chamber 6, a refrigerant such as perfluoropolyether for controlling temperature can be supplied via a refrigerant inlet pipe 7. The refrigerant supplied is circulated through the refrigerant chamber 6 and discharged by way of a refrigerant discharging pipe 8 to the outside. The cold heat generated during the circulation is transmitted from the refrigerant chamber 6 to wafer W via the susceptor 5, cooling the processed surface of wafer W to a desired temperature.

Figure 2:
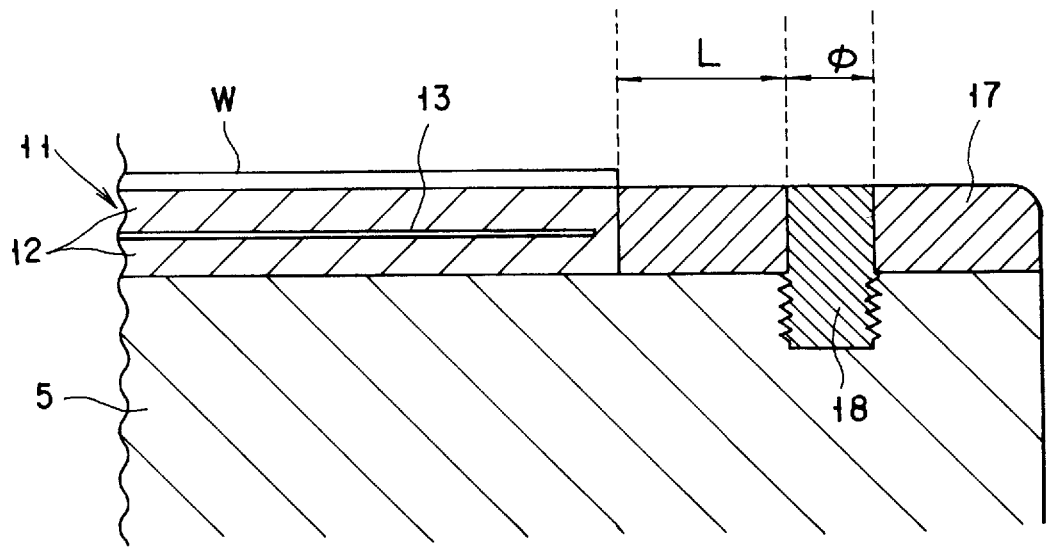
FIG. 2 is a magnified sectional view showing an measuring electrode of the plasma etching apparatus according to FIG. 1.

At the center upper surface of the susceptor 5, an electrostatic chuck 11 having a substantially identical shape to wafer W is provided. As shown in FIG. 2, the electrostatic chuck 11 is formed of two polymer films 12 made of polyimide sandwiching a conductive layer 13 such as a Cu layer. If a direct-current high voltage of 1.5 kV, for example, is applied to the conductive layer 13 from a high-voltage direct current source 14 provided outside the processing vessel 3, wafer W mounted on the upper surface of the electrostatic chuck 11 can be adhered by means of the Coulomb force and held thereon.

To the electrostatic chuck 11, holes for lifter pins (not shown) for moving wafer W vertically up and down and heat transfer gas supply holes 15 are concentrically provided. To each of the heat transfer gas supply holes 15, a heat transfer gas supply pipe 16 is connected. A gas such as a He gas having a controlled predetermined pressure is supplied to a narrow space formed between the rear surface of wafer W and the upper surface of the electrostatic chuck, thereby enhancing an efficiency of transferring heat from the refrigerant chamber 6 to wafer W.

The upper-edge peripheral portion of the susceptor 5, an annular focus-ring 17 is provided so as to surround wafer W mounted on the electrostatic chuck 11. The focus-ring 17, which is made of an insulating material such as quartz to avoid attracting reactive ions, plays a role for striking reactive ions generated by a plasma only against wafer W placed inside the focus-ring 17.

Figure 3:
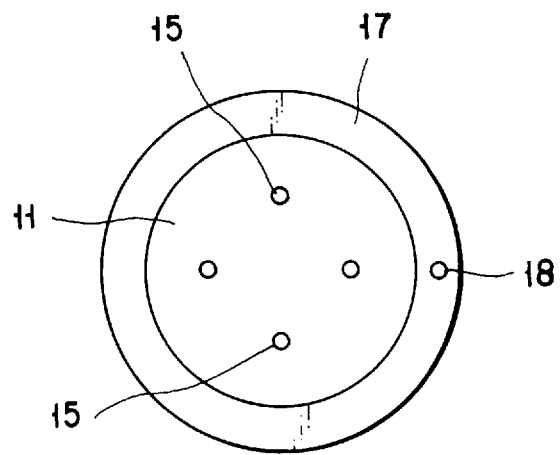
FIG. 3 is a plan view showing an electrostatic chuck and a focus-ring of the plasma etching apparatus shown in FIG. 1.

The measuring electrode 18 is vertically inserted through the focus-ring 17, as shown in FIGS. 2 and 3. An almost lower half of the measuring electrode 18 is screwed on the susceptor 5. The measuring electrode 18 is made of a semiconductor such as silicon, and electrically connected to the susceptor 5 since it is screwed on the susceptor. The upper surface of the measuring electrode 18 is placed so as to be in substantially the same plane as the upper surface of the focus-ring 17.

The measuring electrode 18 has a diameter $\phi$ of about 5 to 15 mm and positioned about 5 to 15 mm (indicated as "L" in FIG. 2) apart from the outer periphery of wafer W.

Above the susceptor 5, at about 15 to 20 mm apart from the susceptor 5, an upper electrode 21 is provided. The upper electrode 21 is fixed on the upper inner wall of the processing vessel 3 so as to be opposed in parallel. Since the upper electrode 21 is electrically connected to the processing vessel 3, it is grounded on the earth. The upper electrode 21 has an electrode plate 23 made of SiC or amorphous carbon with numerous diffusion holes 22 on the surface facing the susceptor 5. The inner structure of the upper electrode 21 is a hollow-body.

At the center of the upper electrode 21, a gas inlet 24 is provided. To the gas inlet 24, a gas supply pipe 26 is connected via a valve 25. To the gas supply pipe 26, a processing-gas supply source 28 for supplying a predetermined etching reaction gas such as a $CF_4$ gas is connected via a mas-flow controller 27. Accordingly, the $CF_4$ gas of the processing gas supply source 28 is introduced from a gas inlet 24 and passes through the hollow portion of the upper electrode 21 and supplied from diffusion holes 22 so as to strike against wafer W, uniformly.

To the lower side wall of the processing vessel 3, an exhaust vent 31 is provided. To the exhaust vent 31, connected is an exhaust duct 33 which is further connected to vacuum means 32 such as a turbo molecular pump. The atmosphere of the processing vessel 3 is reduced, by the operation of the vacuum means 32, to a predetermined pressure ranging from 1 mTorr to 200 mTorr.

A ring-form baffle plate 34 is provided to the outer periphery of the susceptor 5 at a position above the exhaust vent 31 and below the focus-ring 17. In the baffle plate 34, numerous holes are provided. Air vacuum and gas exhaustion of the processing vessel are effected uniformly by way of the baffle plate 34 provided to the outer periphery of the susceptor.

A high frequency power is applied for generating a plasma in the processing vessel 3 of the etching apparatus 1. More specifically, to the susceptor 5 constituting the lower electrode, 13.56 MHz frequency power is applied from the high frequency power source 43 by way of a matching device 41 and a power supply rod 42. By the power application, a plasma is generated between the susceptor 5 and the upper electrode 21 grounded to the earth. In the power supply rod 42 serving as a high frequency power supply passage, an end of the lead wire 44 is connected to a point on the rod 42 near the matching device 41. The other end of the lead wire 44 is connected to a voltage indicator 46 for monitoring $V_{DC}$ via the RF filter 45. It should be noted that the lead wire 44, RF filter 45 and voltage indicator 46 can be housed in the matching device 41.

The measuring electrode 18 is electronically connected to controlling means 47 which is further electrically connected to the high frequency power supply source 43. The controlling means 47 stores data on a previously determined constant correlation between the $V_{DC}$ level generated on wafer W and that around wafer W. Accordingly, the controlling means 47 can appropriately control the amount of power to be supplied from the high frequency power supply source 43, in accordance with the $V_{DC}$ values of wafer W calculated from the data of the $V_{DC}$ value measured by the measuring electrode 18.

To the etching apparatus 1, a loadlock chamber 52 is adjoined via a gate valve 51. An object, wafer W is transferred between the processing vessel 3 and the loadlock chamber 52 by means of transferring means 53 (e.g., a transferring arm) provided in the loadlock chamber 52.

The etching apparatus 1 according to the present invention is constructed as mentioned in the foregoing. Hereinbelow, we will present an etching process of a silicon oxide film ($SiO_2$) formed on wafer W using the etching apparatus 1.

Wafer W is transferred from the loadlock chamber 52 into the processing vessel 3 by the transferring means 53 after the gate valve 51 is opened. The wafer is then mounted on the electrostatic chuck 11. Wafer W is adhered by the application of the high-voltage D.C. power 14 and held on the electrostatic chuck 11. After the transferring means 53 is moved back to the loadlock chamber 52, the pressure in the processing vessel 3 is reduced by the vacuum means 32.

On the other hand, when a valve 25 is opened, a $CF_4$ gas is introduced into the hollow portion of the upper electrode 21 from the processing gas supply source 28 by way of the gas supply pipe 26 and gas inlet 24. The $CF_4$ gas thus supplied is further discharged through the diffusion holes 22 of the electrode plate 23 so as to supply against wafer W, uniformly, as indicated by arrows of FIG. 1.

When the pressure of the processing vessel 3 is set to and maintained at 50 mTorr and a 13.56 MHz high frequency power is then applied to the susceptor 5 from the high frequency power supply 43, a plasma is generated between the upper electrode 21 and the susceptor 5. The plasma dissociates the $CF_4$ gas introduced to the processing vessel 3 into radical components, which etch the $SiO_2$ film formed on wafer W.

In this case, $V_{DC}$ is also generated at the measuring electrode 18 provided in the focus-ring 17. However, the measuring electrode 18 is electrically connected to the susceptor 5, so that the $V_{DC}$ thus generated can be measured by the voltage indicator 46 via the power supply line 42. The $V_{DC}$ determined by the voltage indicator 46 is a value not completely identical to the $V_{DC}$ level generated on wafer W, but a real value actually measured in the plasma near wafer W. Hence, between the real value and the $V_{DC}$ value generated on wafer W, a constant correlation is observed. If the correlation between the $V_{DC}$ level on wafer W and the $V_{DC}$ level measured by the measuring electrode 18 is previously known by using a dummy wafer and the like, the $V_{DC}$ level actually generated on wafer W can be known immediately, on the basis of the $V_{DC}$ value determined by the measuring electrode 18.

If the $V_{DC}$ level on wafer W differs from that of a recipe for processing an object, it would be necessary to control the high frequency power supply 43 by using appropriate controlling means. Through the control, $V_{DC}$ can be automatically set to and maintained at the predetermined level. As a result, a desired etching can be constantly performed, improving a throughput.

The upper surface of the measuring electrode 18 is in the same plane as that of the focus-ring 17 to which the measuring electrode 18 is attached. Therefore, an abnormal discharge may not occur and $V_{DC}$ can be measured effectively. To be more specific, if the upper surface of the measuring electrode 18 is projected compared to the surface of the focus-ring 17, an electric discharge will likely occur at the projecting portion since an electric field of the projecting portion differs significantly from other portions. Conversely, if the upper surface of the measuring electrode 18 is depressed in the focus-ring 17, the correlation with the $V_{DC}$ generated on wafer W will be hardly established. In this respect, the measuring electrode of the present invention is advantageous since it measures $V_{DC}$ effectively without occurrence of abnormal discharge. This is because the upper surface of the measuring electrode 18 is in the same plane as the surface of the focus-ring 17, as mentioned above.

The signals of measured $V_{DC}$ is obtained by way of the susceptor 5 and power supply line 42, so that the independent signal line is not necessarily constructed in the susceptor 5. The structure surrounding the susceptor 5 and the insulated holding plate 4 will not be complicated.

Figure 4:
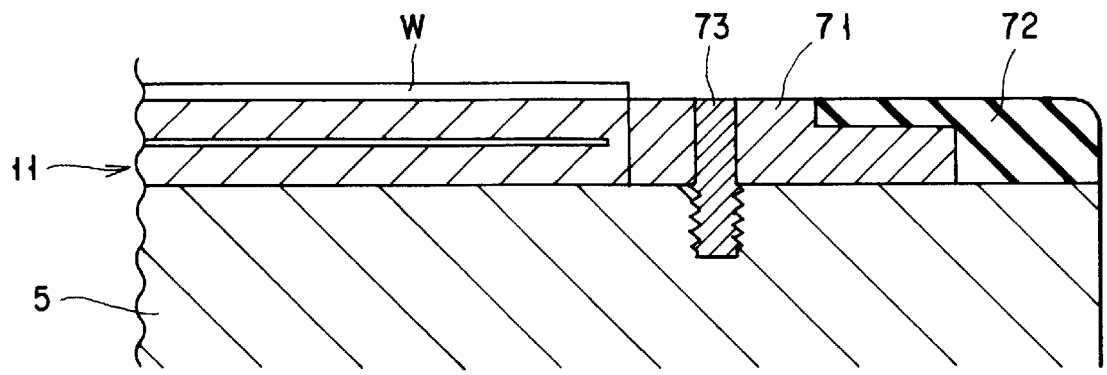
FIG. 4 is a magnified cross-sectional view showing a measuring electrode provided to an inner focus-ring having an electric conductivity.

In this embodiment, the focus-ring 17 has insulating properties. However, the measuring electrode can be provided to the focus-ring having a conductive property. To describe more specifically, as shown in FIG. 4, if an inner focus-ring 71 made of a conductive material such as silicon and an outer focus-ring 72 made of quartz having insulation property are placed around an electrostatic chuck 11 in this order, the periphery of wafer W can be etched at an equal rate. In this case, if the measuring electrode 73 made of the same material as that of the inner focus-ring 71 is inserted through the inner focus-ring 71 and its lower end portion is screwed on the susceptor 5, a $V_{DC}$ constantly correlated with $V_{DC}$ generated on the wafer W, can be measured. It should be noted that the measuring electrode may be provided to the outer focus-ring, an inner focus-ring is made of a material having an insulating property and an outer focus-ring is made of a material having conductive property.

Figure 5:
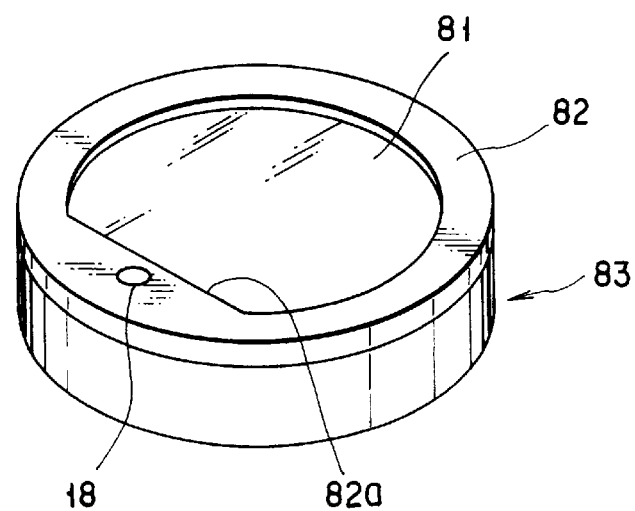
FIG. 5 is a perspective view showing a measuring electrode provided to a focus-ring whose interior portion has a shape corresponding to a wafer.

Furthermore, a susceptor 83 is proposed, as shown in FIG. 5. The susceptor 83 is constructed as follows: The upper surface of an electrostatic chuck 81 has a shape consistent with the peripheral shape of a wafer. To a focus-ring 82 provided around the electrostatic chuck 81, a depressed portion is provided having the same peripheral shape as the outer peripheral shape of the wafer. The height of the focus-ring 82 is set to nearly the same as the thickness of the wafer. The inner periphery of the focus-ring 82 is not a real circle. In the inner periphery, a string portion 82a is partly formed so as to correspond to the orientation flat of the wafer. A wafer is held by being fitted in the depressed portion formed by the focus-ring 82.

Figure 6:
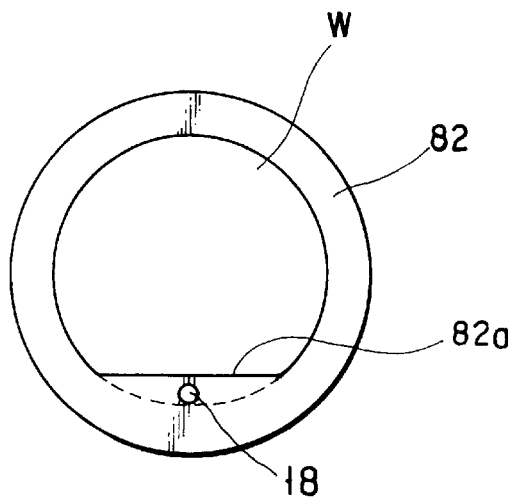
FIG. 6 is a plan view showing a measuring electrode provided to a focus-ring whose interior portion has a shape corresponding to a wafer.

In this case, a measuring electrode 18 may be provided near the string portion 82a. If so, the electrode 18 can be positioned within the imaginary circle extending from the inner peripheral of the focus-ring 82, having the same diameter as that of the wafer, as shown in FIG. 6. As a result, it is possible to obtain the $V_{DC}$ value closer to a real $V_{DC}$ level generated on wafer W.

In the embodiments, we have explained an apparatus for etching a silicon oxide ($SiO_2$) film provided on the surface of a silicon semiconductor wafer. However, the apparatus of the present invention will not be limited to the aforementioned embodiments and will be quite effectively used in etching a polysilicon film, a tungsten film and the like.

The etching apparatus explained above is one of the embodiments of the present invention. The present invention, therefore, will not be limited thereto and may be used in other plasma processing apparatuses such as an ashing apparatus, CVD apparatus, and sputtering apparatus.

According to the present invention, since a power supply passage to a lower electrode can be directly used as the signal line for use in measuring a $V_{DC}$ level, the plasma apparatus will be simplified in its structure. In addition, there is a constant correlation between the $V_{DC}$ value measured by the measuring electrode and a real $V_{DC}$ value actually generated on an object, so that the $V_{DC}$ level generated on an object can be obtained quite accurately. Furthermore, the $V_{DC}$ value can be efficiently measured without the occurrence of abnormal discharge due to the presence of the measuring electrode.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus comprising:
   a processing chamber;
   a supporting electrode for supporting an object to be processed in the processing chamber;
   a high-frequency power source electrically connected to the supporting electrode for providing a high-frequency power to the supporting electrode to generate a plasma in the processing chamber;
   a measuring electrode provided near the object supported by the supporting electrode and exposed to the plasma, the measuring electrode measuring a self bias electrode potential near the object;
   means for electrically connecting the measuring electrode to the supporting electrode; and
   means for obtaining the self bias electrode potential measured by the measuring electrode, by removing the high-frequency component of the high-frequency power, the obtaining means electrically connected to the supporting electrode.

2. The apparatus according to claim 1, wherein said connecting means includes a screw connection for mechanically and electrically connecting the measuring electrode to the supporting electrode.

3. The apparatus according to claim 1, wherein said measuring electrode has an end upper face exposed to the plasma, and said supporting electrode has an upper surface on which the object is mounted, and the end upper face of the measuring electrode is positioned in the substantially same plane as the upper surface of the supporting electrode.

4. The apparatus according to claim 1, wherein said supporting electrode includes an electrostatic chuck for supporting the object thereon, a focus-ring mounted on the supporting electrode and surrounding the object supported by the electrostatic chuck, and a power source for supplying an electric power to the electrostatic chuck.

5. The apparatus according to claim 1, wherein said obtaining means includes controlling means electrically connected to the high-frequency power source, for controlling the amount of high-frequency power provided by the high-frequency power, on the basis of the self bias electrode potential measured by the measuring electrode.

6. The apparatus according to claim 4, wherein said measuring electrode is provided to said focus-ring.

7. The apparatus according to claim 4, wherein said focus-ring comprises a first focus-ring, and a second focus-ring provided outside said first focus-ring, said first focus-ring having a conductive property, said second focus-ring having an insulating property, and said measuring electrode being provided to said first focus-ring.

8. The apparatus according to claim 4, wherein said focus-ring comprises a first focus-ring, and a second focus-ring provided outside said first focus-ring, said first focus-ring having an insulating property, said second focus-ring having a conductive property, and said measuring electrode being provided to said second focus-ring.

9. The apparatus according to claim 4, wherein said focus-ring has a depressed portion having substantially the same shape as that of said object, and has substantially the same thickness as that of a said object.

10. The apparatus according to claim 1, wherein said object is a semiconductor wafer having an orientation flat and said measuring electrode is provided in the proximity of said orientation flat.

11. The apparatus according to claim 4, wherein a hole for supplying a heat transfer gas to a space between said electrostatic chuck and said object is formed in the supporting electrode.

12. The apparatus according to claim 9, further comprising heat transfer gas supply means for supplying a heat transfer gas to a space between said electrostatic chuck and said object.

* * * * *